(12) United States Patent
Linderman

(10) Patent No.: US 10,686,399 B2
(45) Date of Patent: Jun. 16, 2020

(54) APPARATUS FOR MOUNTING A POWER CONDITIONER TO A PHOTOVOLTAIC MODULE FRAME

(71) Applicant: Enphase Energy, Inc., Petaluma, CA (US)

(72) Inventor: Ryan Linderman, Oakland, CA (US)

(73) Assignee: Enphase Energy, Inc., Petaluma, CA (US)

( * ) Notice: Subject to any disclaimer, the term of this patent is extended or adjusted under 35 U.S.C. 154(b) by 626 days.

(21) Appl. No.: 15/061,131

(22) Filed: Mar. 4, 2016

(65) Prior Publication Data

US 2016/0261229 A1    Sep. 8, 2016

Related U.S. Application Data

(60) Provisional application No. 62/129,236, filed on Mar. 6, 2015.

(51) Int. Cl.
| | |
|---|---|
| *H02S 30/10* | (2014.01) |
| *F16B 1/00* | (2006.01) |
| *H02S 40/32* | (2014.01) |
| *H02S 40/34* | (2014.01) |
| *H02S 40/36* | (2014.01) |
| *H02S 40/38* | (2014.01) |
| *H02S 40/30* | (2014.01) |
| *H02S 20/20* | (2014.01) |
| *F16B 1/02* | (2006.01) |

(52) U.S. Cl.
CPC .............. *H02S 30/10* (2014.12); *F16B 1/00* (2013.01); *H02S 40/32* (2014.12); *H02S 40/34* (2014.12); *H02S 40/345* (2014.12); *F16B 1/02* (2013.01); *F16B 2001/0064* (2013.01); *H01L 2924/171* (2013.01); *H01L 2924/1711* (2013.01); *H02S 20/20* (2014.12); *H02S 40/30* (2014.12); *H02S 40/36* (2014.12); *H02S 40/38* (2014.12)

(58) Field of Classification Search
CPC ........ H02S 30/10; H02S 40/32; H02S 40/345; H02S 40/34; H02S 20/20; H02S 40/30; H02S 40/38; H02S 40/36; F16B 1/00; F16B 2001/0064; F16B 1/02; F16B 2001/0092; F16B 11/006; H01L 2924/1711; H01L 2924/171
See application file for complete search history.

(56) References Cited

U.S. PATENT DOCUMENTS

| | | | | |
|---|---|---|---|---|
| 2011/0061705 A1* | 3/2011 | Croft | ....................... | H02S 40/32 136/244 |
| 2011/0114154 A1* | 5/2011 | Lichy | ................ | H01L 31/02013 136/246 |
| 2011/0192644 A1* | 8/2011 | Santiago | ................ | H02G 3/085 174/520 |

(Continued)

*Primary Examiner* — Michael Y Sun
(74) *Attorney, Agent, or Firm* — Moser Taboada

(57) ABSTRACT

An apparatus for mechanically coupling a power conditioner to a photovoltaic (PV) module frame. In one embodiment, the apparatus comprises: a bracket, adapted for mechanically coupling the power conditioner to the PV module frame, comprising at least one inner-flange tab and at least one outer-flange tab for trapping a flange of the PV module frame between them; and at least one self-locking mounting structure for locking the bracket to the PV module frame without requiring any holes in the PV module frame.

20 Claims, 6 Drawing Sheets

(56) References Cited

U.S. PATENT DOCUMENTS

| | | | |
|---|---|---|---|
| 2012/0151721 A1* | 6/2012 | Lin | B25B 5/06 24/457 |
| 2013/0048056 A1* | 2/2013 | Kilgore | F24J 2/5256 136/251 |
| 2013/0087899 A1* | 4/2013 | Lin | H01L 23/49551 257/675 |
| 2016/0173028 A1* | 6/2016 | Andrews | H01R 4/26 136/251 |

* cited by examiner

APPARATUS FOR MOUNTING A POWER CONDITIONER TO A PHOTOVOLTAIC MODULE FRAME

CROSS-REFERENCE TO RELATED APPLICATION

This application claims priority to U.S. Provisional Patent Application No. 62/129,236 filed on Mar. 6, 2015, which is herein incorporated in its entirety by reference.

BACKGROUND OF THE INVENTION

Field of the Invention

Embodiments of the present disclosure relate generally to power conditioners and, more particularly, to an apparatus for coupling a power conditioner to a photovoltaic module frame.

Description of the Related Art

Traditional photovoltaic (PV) frame-attach systems for mounting a power conditioner to a PV module frame utilize an adapter plate in addition to a mounting member built into the power conditioner enclosure. In order to couple the power conditioner to the PV module frame, multiple bolts or fasteners are used that require a specific torque during assembly to provide a sufficient retention force. Such systems thus require additional components (e.g., nuts, bolts, brackets, tools for assembly, and the like) as well as time and effort spent drilling holes in specific locations on the PV module frame and then assembling the bracket and fasteners and attaching them to the frame.

Therefore, there is a need in the art for an apparatus for efficiently mounting a power conditioner to a PV module frame.

SUMMARY OF THE INVENTION

Embodiments of the present invention generally relate to an apparatus for apparatus for mechanically coupling a power conditioner to a photovoltaic (PV) module frame substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
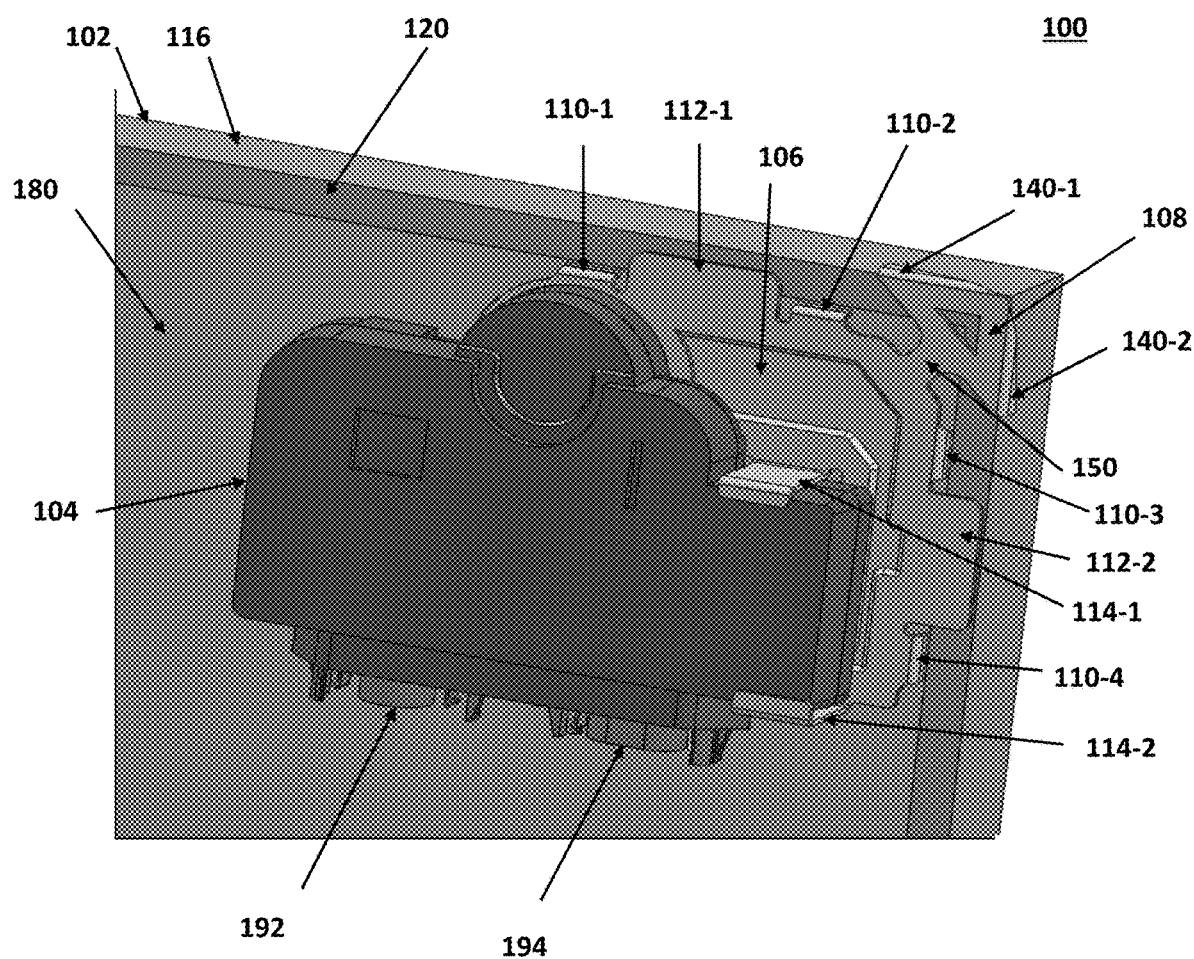
FIG. 1 is a bottom angled perspective view of a power module assembly in accordance with one or more embodiments of the present invention.

FIG. 1 is a bottom angled perspective view of a power module assembly 100 in accordance with one or more embodiments of the present invention. The power module assembly comprises a PV module 102 coupled to a power conditioner 104 via frame-mounting bracket 106 (which may also be referred to as "bracket 106"). The power conditioner 104 comprises a module level power electronics (MPLE) enclosure encasing power electronics that are electronically coupled to the DC output from the PV module 102, for example via a cable connector 192 of the power conditioner 104. The power electronics convert the DC power received from the PV module 102 to an output power (DC or AC) that may be coupled to an output via an AC cable connector 194 of the power conditioner 104.

The PV module 102 comprises a frame 116 that surrounds the perimeter of a solar panel 180 and may be constructed of any rigid material, such as aluminum, rigid plastic, and the like, or any combination of such rigid materials. The PV module frame comprises a flange 120 running generally around the perimeter on the rear side of the frame 116.

In accordance with one or more embodiments of the present invention, the frame-mounting bracket 106 is a flexible-plate bracket that securely couples the power conditioner 104 to the frame 116 without using any holes in the frame 116 and without using any secondary fasteners such as bolts, nuts, washers, and the like. The bracket 106 is self-locking to the frame 116 and can be removed from the PV module 102 as needed.

The bracket 106 comprises a plurality of mounting members for mechanically coupling and self-locking the power conditioner 104 to the frame 116. Generally the bracket 106 removeably couples the power conditioner 104 to the frame 116 such that it can be manually de-coupled from the frame 116 without requiring any special tools. The bracket 106 comprises a plurality of offset tabs, including outer-flange tabs 112-1 and 112-2 (collectively referred to as outer-flange tabs 112) and inner-flange tabs 110-1, 110-2, 110-3 and 110-4 (collectively referred to as inner-flange tabs 110). The inner-flange tabs 110 are offset from the outer-flange tabs 112; for example, as depicted in FIG. 1 the inner-flange tabs 110-1 and 110-2 are straddle the horizontal edges of the outer-flange tab 112-1, and the inner-flange tabs 110-3 and 110-4 straddle the horizontal edges of the outer-flange tab 112-2. In other embodiments, the inner-flange tabs 110 and the outer-flange tabs 112 may be positioned differently but still remain offset from one another.

The bracket 106 also comprises spring clips 114-1 and 114-2, collectively referred to as spring clips 114, and a spring-action corner-locking member 108. Other embodiments of the bracket 106 may comprise additional or fewer of one or more of the outer-flange tabs 112, the inner-flange tabs 110, the spring clips 114, or the corner-locking member 108.

The bracket 106 is substantially L-shaped and is formed from a single piece of stamped sheet metal. In other embodiments, the bracket 106 may have a different shape and/or may be formed from a different rigid material, such as a different type of metal, rigid plastic, or the like. In some embodiments, the bracket is made of aluminum, although other materials may be used in other embodiments. In one or more embodiments, the bracket 106 or portions of the bracket 106 are formed from a thermally-conductive material such that the bracket 106 acts as a heat-spreader to spread heat generated by the power conditioner 104.

The bracket 106 is generally affixed to the power conditioner 104 using an adhesive; after the adhesive is applied, the power conditioner 104 is snap-fit to the bracket 106 via the spring clips 114. The spring clips 114 extend perpendicular from the face to the bracket 106 to securely fasten the bracket 106 to the power conditioner 104 and hold the power conditioner 104 in place while the adhesive cures. In some embodiments, a high-performance silicone adhesive and sealant may be used to affix the bracket 106 to the power conditioner 104, such as PV-804, although in other embodiments other types of sealants may be used. Although two spring clips 114 are depicted in FIG. 1, additional spring clips 114 may be used in other embodiments.

The inner-flange tabs 110 and the outer-flange tabs 112 are positioned along the two frame-facing edges of the bracket 106 (i.e., the inner-flange tabs 110 and the outer-flange tabs 112 extend outward from the bracket edges that face the frame 116). The inner-flange tabs 110 are positioned on the inner-side of the flange 120 (i.e., the side of the flange 120 facing the solar panel 180) and the outer-flange tabs 112 are positioned on the outer-side of the flange 120 (i.e., the side of the flange facing away from the solar panel 180) such that the flange 120 is held between the inner-flange tabs 110 and the outer-flange tabs 112. The inner-flange tabs 110 and the outer-flange tabs 112 trap the power conditioner 104/bracket 106 in the plane of the frame 116, thereby allowing the bracket 106 to be secured to the frame 116.

In certain embodiments, such as the embodiment depicted in FIG. 1, the bracket 106 is mechanically self-locked to the frame 116 via the corner-locking member 108. The corner-locking member 108 is substantially triangular in shape and comprises locking member flanges 140-1 and 140-2 (collectively referred to as locking member flanges 140) disposed along opposite outer edges of the corner-locking member 108 to fit over a corner of the frame 116. The corner-locking member 108 extends from the main body of the bracket 116 at a locking-member joint 150. The locking-member joint 150 (i.e., the narrow span between the corner-locking member 108 and the main body of the bracket 106) is sufficiently elastic to allow a spring-like motion so that the corner-locking member 108 opens as it is being pushed into the frame corner and then snaps down as the locking member flanges 140 pass over the frame edge. Generally, the locking-member joint 150 is a moveable joint that enables the corner-locking member 108 to be flexed out-of-plane with respect to the main body of the bracket 106 such that it snaps over the frame corner to trap the bracket 106 in the corner of the frame 116. In other embodiments, other types of joints may be used for the locking-member joint 150.

In order to mechanically couple the bracket 106 to the frame 116, the inner-flange tabs 110 and the outer-flange tabs 112 are aligned with the flange 120 such that the inner-flange tabs 110 are disposed along the inner face of the flange 120 and the outer-flange tabs 112 are disposed along the outer face of the flange 120. The corner locking member 108 is then pulled up—i.e., outwards from the plane of the bracket 106—and slid over the edge of the frame 116 such that the locking member flanges 140 are positioned on the exterior sides of the frame 116. The spring-action of the corner locking member 108 retracts to bring the corner locking member 108 substantially flush with the frame 116, where the locking member flanges 140 are disposed along the exterior walls of the frame corner and secure the corner locking member 108 to the corner of the frame 116. The corner locking member 108 may then be manually pressed downward toward the frame 116 to further securely fasten the bracket 106 to the frame 116.

The frame-mounted bracket 106 can be removed from the frame 116 as needed; for example, an edge such as the tip of a screwdriver may be slide between the corner locking member 108 and the frame 116 to disengage the corner locking member 108 from the frame 116.

In certain embodiments, the corner locking member 108 comprises one or more sharp edges to "bite" into the frame material. In one or more of such embodiments where the bracket 106 and the frame 116 are each made from an electrically conductive material, such biting into the frame material provides firm electrical contact for grounding purposes. For example, in some embodiments the power conditioner 104 may comprise a non-conductive touch-safe enclosure that's double insulated; in such embodiments, the bracket 106 may be grounded via the frame 116 and the PV module racking.

In one or more embodiments, the spring-action mechanism of the corner locking member 108 may provide a constant tension force pulling the bracket 106 and the power conditioner 104 into the corner position of the frame 116 to ensure better contact with the frame 116. In some alternative embodiments, the corner locking member 108 may be built up in a separate assembly that is later bonded to a standard PV module mounting plate that accepts the power conditioner 104.

Those of ordinary skill in the art will recognize that the bracket 106 described herein may be customized to fit particular power conditioners 104 (i.e., their MPLE enclosures), PV module frames, racks, and the like. For example, the bracket 106 may be elongated on one or more sides, the spring-locking corner locking member 108 may be expanded or shrunk for better trapping on the frame 116, or the like.

Figure 2:
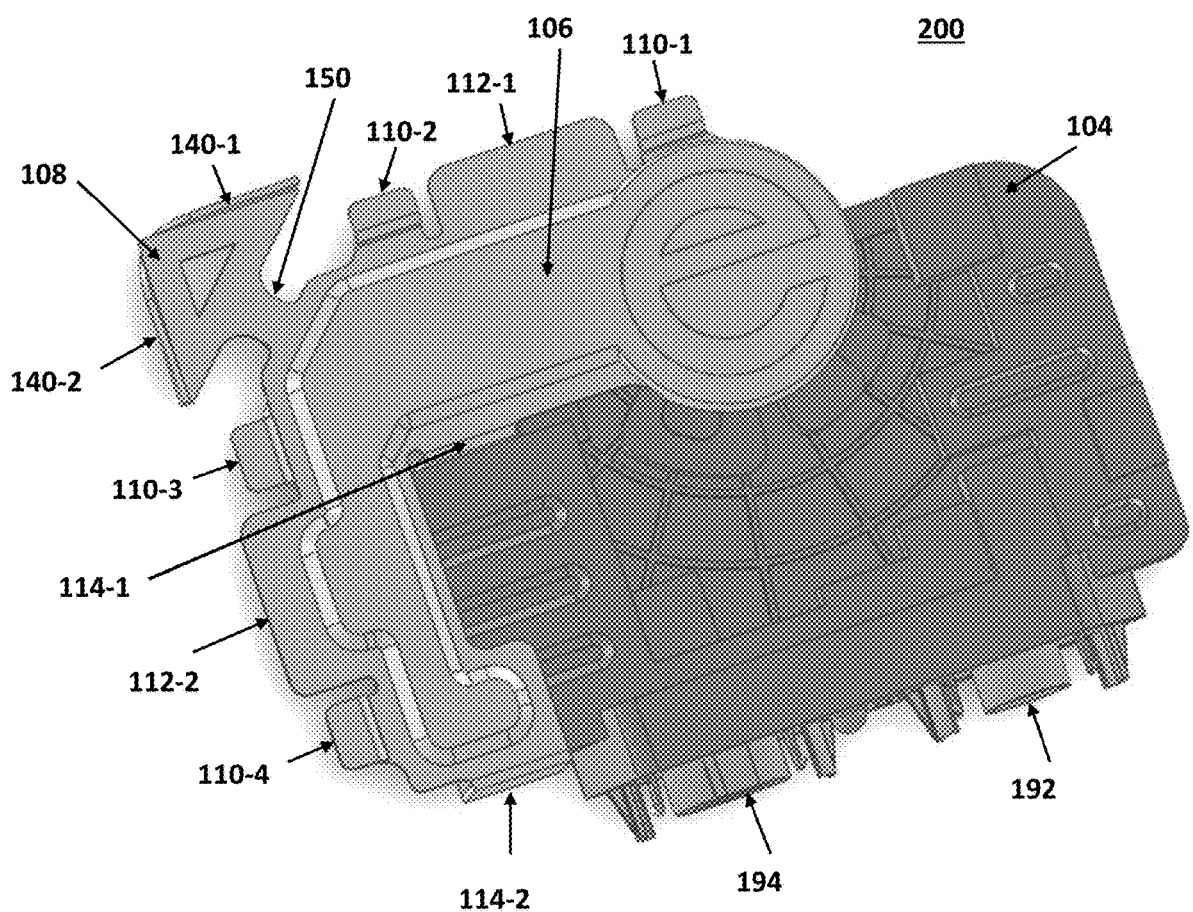
FIG. 2 is a top perspective view of a portion of a bracketed power conditioner assembly in accordance with one or more embodiments of the present invention.

FIG. 2 is a top perspective view of a bracketed power conditioner assembly 200 in accordance with one or more embodiments of the present invention. The top perspective view depicted in FIG. 2 shows the surfaces of the bracketed power conditioner assembly 200 that face the back side of the PV module 102 when the power conditioner assembly 200 is coupled to the PV module 102.

The bracketed power conditioner assembly 200 comprises the bracket 106 coupled to the power conditioner 104. The spring clips 114 hold the power conditioner 104 securely to the bracket 106. As previously described, the bracket 106 may be affixed to the power conditioner 104 using an adhesive; where the power conditioner 104 is held in place via the spring clips 114 while the adhesive cures. Although two spring clips 114 are depicted, in other embodiments the bracket 106 may have fewer or more spring clips 114 and/or other types of fasteners for securing the power conditioner 104 to the bracket 106.

As previously described, on a first outer edge of the bracket 106, the inner-flange tabs 110-1 and 110-2 straddle the outer-flange tab 112-1 and are positioned such that the inner-flange tabs 110-1 and 110-2 are offset for the outer-flange tab 112-1 in both the vertical plane as well as the horizontal plane. Analogously, on a second outer edge of the bracket 106, the inner-flange tabs 110-3 and 110-4 straddle the outer-flange tab 112-2 and are positioned such that the inner-flange tabs 110-3 and 110-4 are offset for the outer-flange tab 112-2 in both the vertical plane as well as the horizontal plane. The vertical distance between the inner-flange tabs 110 and the outer-flange tabs 112 is such that the flange 120 of the frame 116 fits between the inner-flange tabs 110 and the outer-flange tabs 112. In other embodiments, the bracket 106 may have fewer or more inner-flange tabs 110 and/or outer-flange tabs 112.

Figure 3:
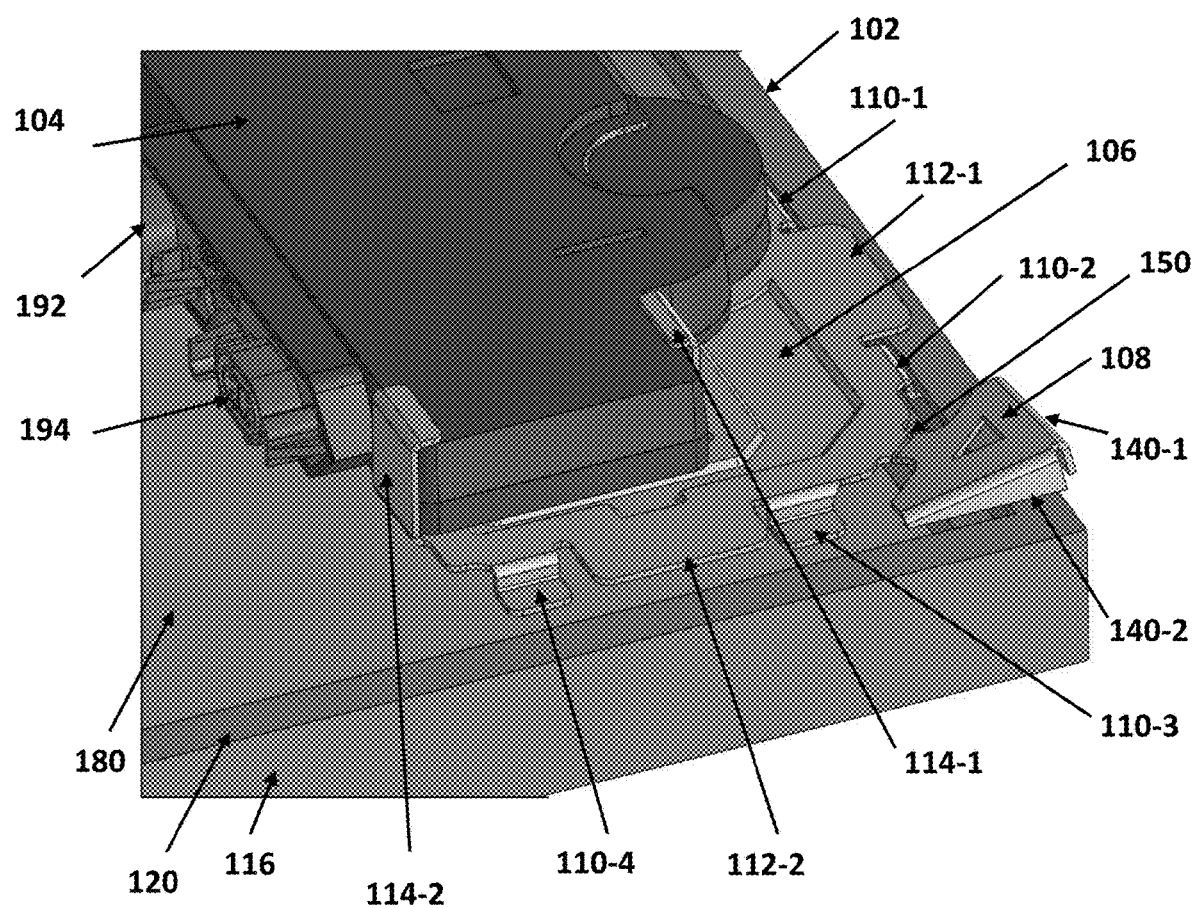
FIG. 3 is a bottom angled exploded perspective view of a power module assembly in accordance with one or more embodiments of the present invention.

FIG. 3 is a bottom angled exploded perspective view of a power module assembly 100 in accordance with one or more embodiments of the present invention.

As depicted in FIG. 3, the corner locking member 108 is flexed at the locking-member joint 150 such that it is positioned outwards from the plane of the bracket 106 and away from the frame 116. The corner locking member 108 can then be slid over the edge of the corner of the frame 116 and snap-fit to the corner such that the locking member flanges 140 are positioned on the exterior sides of the frame corner. The spring-action of the corner locking member 108 then retracts to snap-fit the corner locking member 108 substantially flush with the frame 116, where the locking member flanges 140 are disposed along the exterior walls of the frame corner and secure the corner locking member 108 to the corner of the frame 116.

Figure 4:
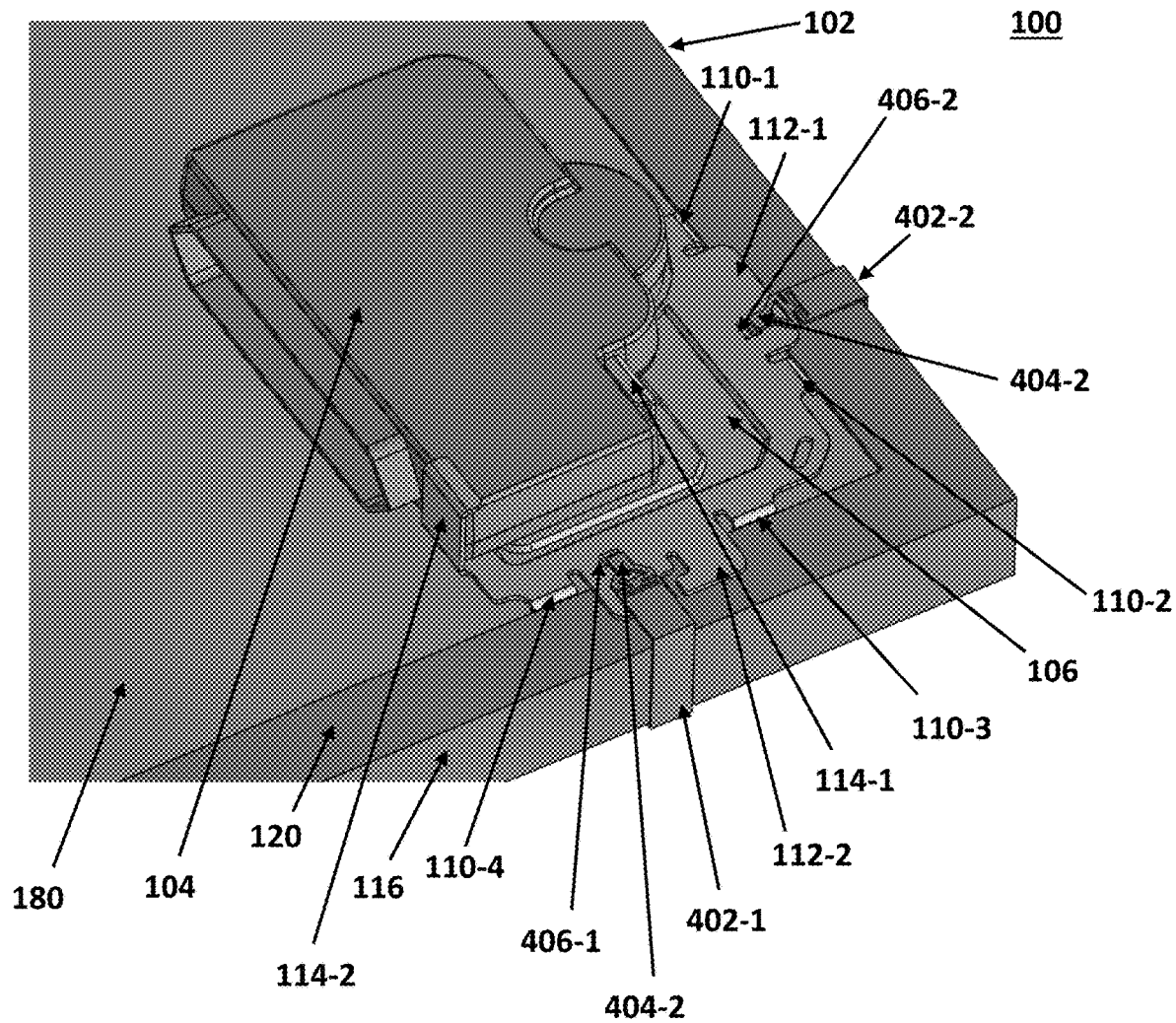
FIG. 4 is a bottom angled perspective view of a power module assembly in accordance with one or more other embodiments of the present invention.

FIG. 4 is a bottom angled perspective view of a power module assembly 100 in accordance with one or more other embodiments of the present invention. The power module assembly 100 comprises the PV module 102 coupled to the power conditioner 104 via the bracket 106. As previously described, the bracket 106 comprises the spring clips 114 for securely fastening the bracket 106 to the power conditioner 104, and the inner-flange tabs 110/outer-flange tabs 112 for holding the frame flange 120 between them.

In some embodiments, such as the embodiment depicted in FIG. 4, the corner locking member 108 is replaced by a first side-latching trap 402-1 and a second side-latching trap 402-2 (collectively referred to as side-latching traps 402). The side-latching traps 402 are separate components from the bracket 106 and are coupled to the frame 116 for mechanically coupling the bracket 106 to the frame 116. The side-latching traps 402 may be made from any suitable rigid material, for example the side-latching traps 402 may be made from the same material as the frame 116 (such as an electrically conductive material), although alternatively they may be made from a different material. In some alternative embodiments, the bracket 106 may comprise both the corner locking member 108 as well as one or more side-latching traps 402.

The side-latching traps 402 are sized and shaped to securely fit to the frame 116. The side-latching traps 402 may be available in a variety of sizes to accommodate different sizes of PV module frames, thereby allowing the bracketed power conditioner assembly 200 to be coupled to a variety of differently-sized PV modules. The side-latching traps 402 are generally removably coupled to the frame 116, for example the side-latching traps 402 may be snap-fit to the frame 116 in order to be replaced or serviced as needed, although in certain embodiments the side-latching traps 402 may be permanently coupled to the frame 116 or even part of the frame 116 itself.

The side-latching traps 402 are self-locking mounting structures that secure the bracket 106 on each of two sides that form a corner of the frame 116, leaving that corner of the frame 116 free to couple as desired with roof mounting fixtures in some rail-less PV racking systems. In some embodiments, the side-latching traps 402 contain spring-like mechanisms to secure the side-latching traps 402 in place. The spring-like mechanisms allow some compliance to stretch out and latch when installing and provide a restoring force that always tries to pull the bracketed power conditioner assembly 200 into the corner of the frame 116, thereby securely retaining it and, in those embodiments where the side-latching traps 402 are formed from an electrically conductive material, electrically grounding the bracket 106 to the frame 116. For example, in certain embodiments such as the embodiment depicted in FIG. 4, the side-latching traps 402-1 and 402-2 comprise hooking features 404-1 and 404-2, respectively, disposed at the interior ends of the side-latching traps 402-1 and 402-2 (i.e., the ends facing the interior of the frame 116). The hooking features 404-1 and 404-2 fit into corresponding receptacles 406-1 and 406-2, respectively, of the bracket 106 to secure the bracket 106 to the frame 116.

In some other embodiments, the side-latching traps 402 may be modified in one or more ways, for example depending on the material and manufacturing method used to manufacture the side-latching traps 402.

Figure 5:
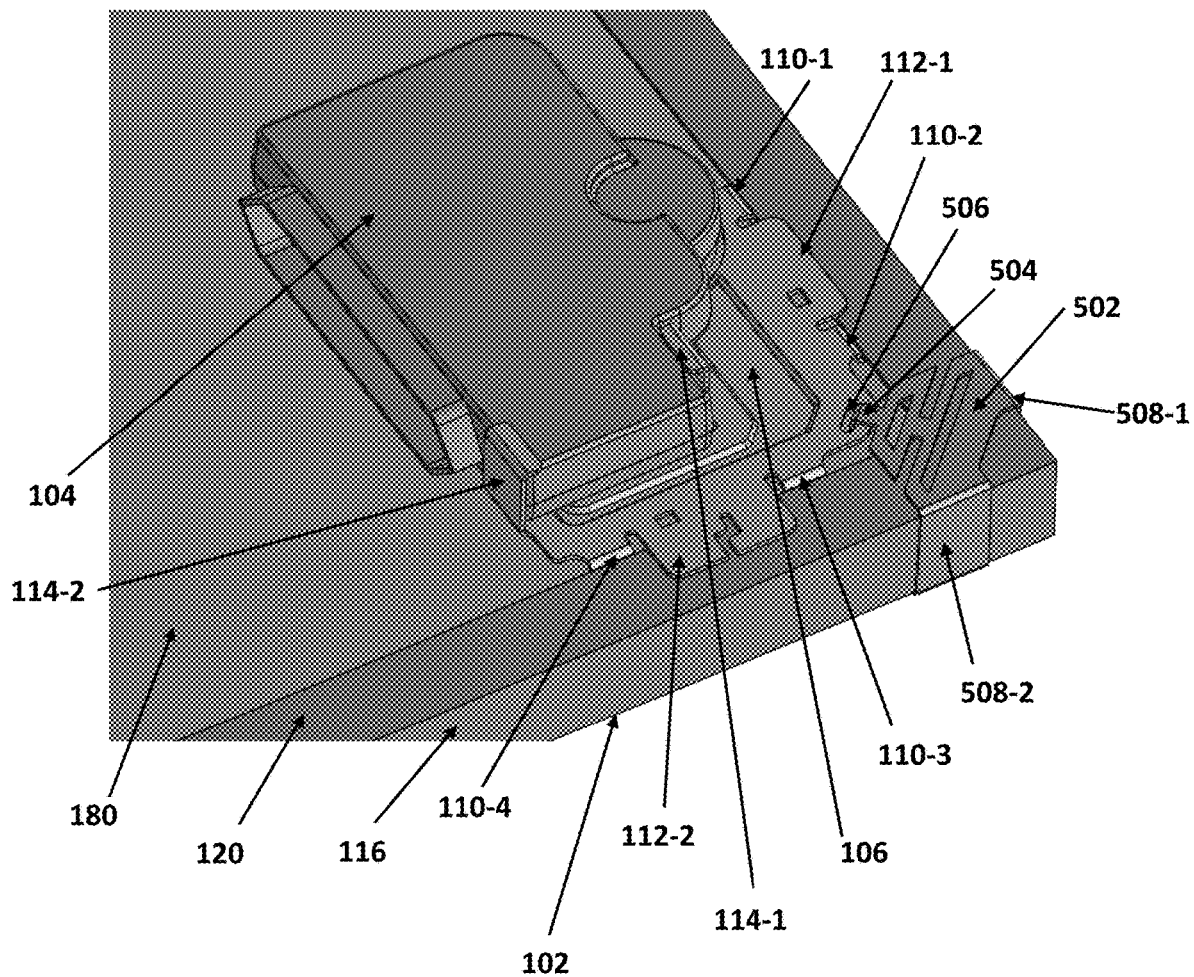
FIG. 5 is a bottom angled perspective view of a power module assembly in accordance with still other embodiments of the present invention.

FIG. 5 is a bottom angled perspective view of a power module assembly 100 in accordance with still other embodiments of the present invention. The power module assembly 100 comprises the PV module 102 coupled to the power conditioner 104 via the bracket 106. As previously described, the bracket 106 comprises the spring clips 114 for securely fastening the bracket 106 to the power conditioner 104, and the inner-flange tabs 110/outer-flange tabs 112 for trapping the frame flange 120 between them.

In one or more embodiments, such as the embodiment depicted in FIG. 5, the corner locking member 108 is replaced by a corner-lock bracket fastener 502, separate from the bracket 106, that is attachable to and detachable from the bracket 106 for securing the bracket 106 to the frame 116. The bracket fastener 502 is sized and shaped to fit securely over a corner of the frame 116 and may be made from any suitable rigid material; for example the bracket fastener 502 may be made from the same material as the frame 116 (such as an electrically conductive material), although alternatively it may be made from a different material. The bracket fastener 502 may be available in a variety of sizes to accommodate different sizes of PV module frames, thereby allowing the bracketed power conditioner assembly 200 to be coupled to a variety of differently-sized PV modules.

The bracket fastener 502 comprises a first frame-attach clip 508-1 and a second frame-attach clip 508-2, collectively referred to as frame-attach clips 508, for fastening the bracket fastener 502 to the frame 116. The frame-attach clips 508 are substantially L-shaped and are disposed on each of two sides that form a corner of the frame 116, although in other embodiments one or both of the frame-attach clips 508 may be differently shaped and/or positioned. In some embodiments, the frame-attached clips 508 may snap-fit the bracket fastener 502 to the frame 116, although in other embodiments the bracket faster 502 may be permanently coupled to the frame 116 or even part of the frame 116 itself.

Figure 6:
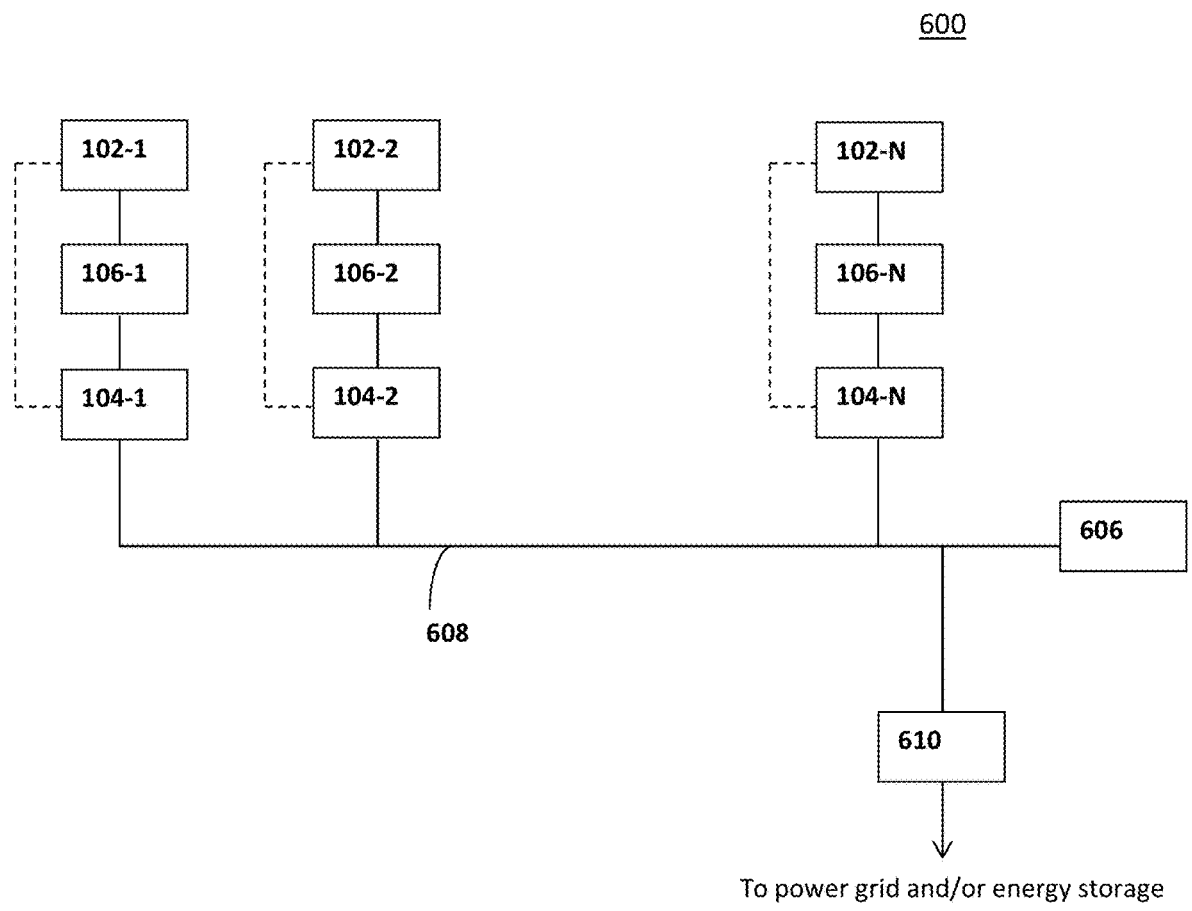
FIG. 6 is a block diagram of a system for power conversion using one or more embodiments of the present invention.

The bracket fastener 502 comprises a spring-action latch 504 that hooks or latches to a corresponding latch receptacle 506 of the bracket 106. For example, as depicted in FIG. 5, the latch receptacle 506 is a hole in the bracket 106 and the spring-action latch 504 has a hook shape that inserts into the latch receptacle 506 to lock the bracket 106 to the frame 116. In other embodiments, one or more components of the bracket fastener 502 may be designed or configured differently but still perform the same functions as described herein. For example, the latch 504 and/or the latch receptacle 506 may have a different shape and/or position while still mating to secure the bracket 106 to the frame 116. As another example, the bracket fastener 502 may comprise a plurality of spring-action latches 504 that are each inserted in corresponding latch receptacles 506 of the bracket 106 while a spring mechanism tightly and securely pulls the bracket 106 towards the frame 116. FIG. 6 is a block diagram of a system 600 for power conversion using one or more embodiments of the present invention. This diagram only portrays one variation of the myriad of possible system configurations and devices that may utilize the present invention. The present invention can be utilized in any system for coupling a power conditioner (e.g., a DC-DC converter, a DC-AC inverter, or the liker) to a photovoltaic (PV) module.

The system 600 comprises a plurality of the power conditioners 104-1, 104-2, . . . 104-N mechanically coupled to a plurality of PV modules 102-1, 102-2, . . . 102-N in a one-to-one correspondence via corresponding brackets 106-1, 106-2, . . . 106-N as described above. Each of the power conditioners 104-1, 104-2, . . . 104-N is further electrically coupled to the corresponding PV module 102-1, 102-2, . . . 102-N as shown by the dashed lines. The system 600 further comprises a controller 606; a bus 608; and a load center 610.

The power conditioners 104 are coupled to the controller 606 via the bus 608. The controller 606 is capable of communicating with the power conditioners 104 by wireless and/or wired communication (e.g., power line communication) for, for example, providing operative control of the power conditioners 104, collecting data from the power conditioners 104, and the like. In some embodiments, the controller 606 may be a gateway that is further coupled by wireless and/or wired techniques to a master controller via a communications network, such as the Internet.

The power conditioners 104 are further coupled to the load center 610 via the bus 608. The power conditioners 104 convert the DC power from the PV modules 102 to an output power; in some embodiments the output power may be DC output power (i.e., the power conditioners 104 are DC-DC converters), while in other embodiments the output power may be AC output power (i.e., the power conditioners 104 are DC-AC converters). The power conditioners 104 couple the generated output power to the load center 610 via the bus 608. The generated power may then be distributed for use, for example to one or more appliances, and/or the generated energy may be stored for later use, for example using batteries, heated water, hydro pumping, $H_2O$-to-hydrogen conversion, or the like. In some embodiments, the power conditioners 104 convert the DC input power to AC power that is commercial power grid compliant and couple the AC power to the commercial power grid via the load center 610.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is defined by the claims that follow.

The invention claimed is:

1. An apparatus for mechanically coupling a power conditioner to a photovoltaic (PV) module comprising a PV module frame, comprising:
    a bracket, adapted for mechanically coupling the power conditioner to the PV module frame, comprising at least one inner-flange tab and at least one outer-flange tab for trapping a flange of the PV module frame between them; and
    at least one self-locking mounting structure for locking the bracket to the PV module frame without requiring any holes in the PV module frame, wherein the at least one inner-flange tab directly contacts an inner surface of the flange of the PV module frame, the at least one outer-flange tab directly contacts an outer surface of the flange of the PV module frame, and wherein the bracket when coupling the power conditioner to the PV module frame is not visible from a plan view.

2. The apparatus of claim 1, wherein the at least one self-locking mounting structure is a corner-locking member adapted to fit over a corner of the PV module frame to lock the bracket to the PV module frame.

3. The apparatus of claim 1, wherein the at least one self-locking mounting structure comprises a first side latch for latching to a first side of the PV module frame and to a first receptacle of the bracket, and a second side latch for latching to a second side of the PV module frame and to a second receptacle of the bracket, for locking the bracket to the PV module frame.

4. The apparatus of claim 1, wherein the at least one self-locking mounting structure employs a spring-action mechanism for self-locking the bracket to the PV module frame.

5. The apparatus of claim 1, wherein the at least one self-locking mounting structure is electrically conductive and is electrically coupled to the PV module frame for grounding the bracket via the PV module frame.

6. The apparatus of claim 1, wherein the bracket is thermally conductive for dissipating heat generated by the power conditioner.

7. The apparatus of claim 1, wherein the at least one inner-flange tab is offset from the at least one outer-flange tab in both a vertical plane and a horizontal plane that is perpendicular to the vertical plane.

8. The apparatus of claim 1, wherein the bracket comprises at least one spring-clip for snap-fitting the power conditioner to the bracket.

9. The apparatus of claim 1, wherein the power conditioner is a DC-AC inverter.

10. The apparatus of claim 1, wherein the power conditioner is a DC-DC converter.

11. A power module assembly, comprising:
    a photovoltaic (PV) module having a frame;
    a bracket, mechanically coupled to the frame and to a power conditioner, comprising at least one inner-flange tab and at least one outer-flange tab that trap a flange of the frame between them; and
    at least one self-locking mounting structure that locks the bracket to the frame without requiring any holes in the frame, wherein the at least one inner-flange tab directly contacts an inner surface of the flange of the frame, the at least one outer-flange tab directly contacts an outer surface of the flange, and wherein the bracket when coupling the power conditioner to the frame is not visible from a plan view.

12. The power module assembly of claim 11, wherein the at least one self-locking mounting structure is a corner-locking member that fits over a corner of the frame to lock the bracket to the frame.

13. The power module assembly of claim 11, wherein the at least one self-locking mounting structure comprises a first side latch latched to a first side of the frame and to a first receptacle of the bracket, and a second side latch latched to a second side of the frame and to a second receptacle of the bracket, to lock the bracket to the frame.

14. The power module assembly of claim 11, wherein the at least one self-locking mounting structure employs a spring-action mechanism to self-lock the bracket to the frame.

15. The power module assembly of claim 11, wherein the at least one self-locking mounting structure is electrically conductive and is electrically coupled to the frame for grounding the bracket via the frame.

16. The power module assembly of claim 11, wherein the bracket is thermally conductive for dissipating heat generated by the power conditioner.

17. The power module assembly of claim 11, wherein the at least one inner-flange tab is offset from the at least one outer-flange tab in both a vertical plane and a horizontal plane that is perpendicular to the vertical plane.

18. The power module assembly of claim 11, wherein the bracket comprises at least one spring-clip that snap-fits the power conditioner to the bracket.

19. The power module assembly of claim 11, wherein the power conditioner is a DC-AC inverter.

20. The power module assembly of claim 11, wherein the power conditioner is a DC-DC converter.

* * * * *